United States Patent [19]

Lean et al.

[11] Patent Number: 4,772,806

[45] Date of Patent: Sep. 20, 1988

[54] SWITCHING DEVICE FOR A SERIES LOOP CIRCUIT

[76] Inventors: Shay Lean, 224 Congressional La., Rockville, Md. 20852; Lawrence D. Hazel, Jr., P.O. Box 35, Delaplane, Va. 22025

[21] Appl. No.: 45,031

[22] Filed: May 1, 1987

[51] Int. Cl.[4] .................. G01R 31/00; G08B 21/00; H01H 9/54; H02J 3/00

[52] U.S. Cl. .......................................... 307/38; 200/2; 200/11 A; 200/11 TC; 200/16 C; 307/17; 307/36; 324/500; 340/635; 323/361

[58] Field of Search ............... 200/2,5 R, 6 R, 8 R, 200/8 A, 11 R, 11 G, 11 J, 11 K, 14, 16 B, 16 C, 16 D, 16 E, 16 F, 11 TC, 17 R, 18, 51 R, 11 A; 307/17, 36, 38, 39, 41, 80, 112, 113, 115; 340/642, 635; 323/318, 361; 324/500, 414

[56] References Cited

U.S. PATENT DOCUMENTS

| | | | |
|---|---|---|---|
| 1,005,521 | 10/1911 | Doughty et al. | 200/2 |
| 2,303,693 | 12/1942 | Hill | 200/6 R |
| 3,061,828 | 10/1962 | Hauck | 340/642 X |
| 3,150,240 | 9/1964 | Voss | 200/8 A |
| 3,249,703 | 5/1966 | Rickert | 307/36 |
| 3,855,521 | 12/1974 | Kiuchi | 307/17 |
| 4,019,128 | 4/1977 | Chebowski | 340/642 X |
| 4,297,632 | 10/1981 | Glaser et al. | 324/414 |
| 4,396,868 | 8/1983 | Watanabe et al. | 340/642 X |
| 4,675,574 | 6/1987 | Delflache | 340/642 X |

Primary Examiner—J. R. Scott
Attorney, Agent, or Firm—Nies, Webner, Kurz & Bergert

[57] ABSTRACT

The present invention relates to a switching device for use in a series loop circuit, and more particularly to a switching device for uncoupling defective circuit components from the series loop circuit, for conducting quick trouble-shooting procedures to locate breaks or shorts in the circuit, and for enabling efficient preventive maintenance programs of the circuit components in order to keep them in good repair, with minimal shutdown time of the circuit or interruption in the supply of power to remaining circuit components. The device according to the invention includes a multi-position selector switch which permits in-situ testing of the circuit components so that down-time of the circuit is significantly reduced, and ease of maintenance is enhanced.

2 Claims, 8 Drawing Sheets

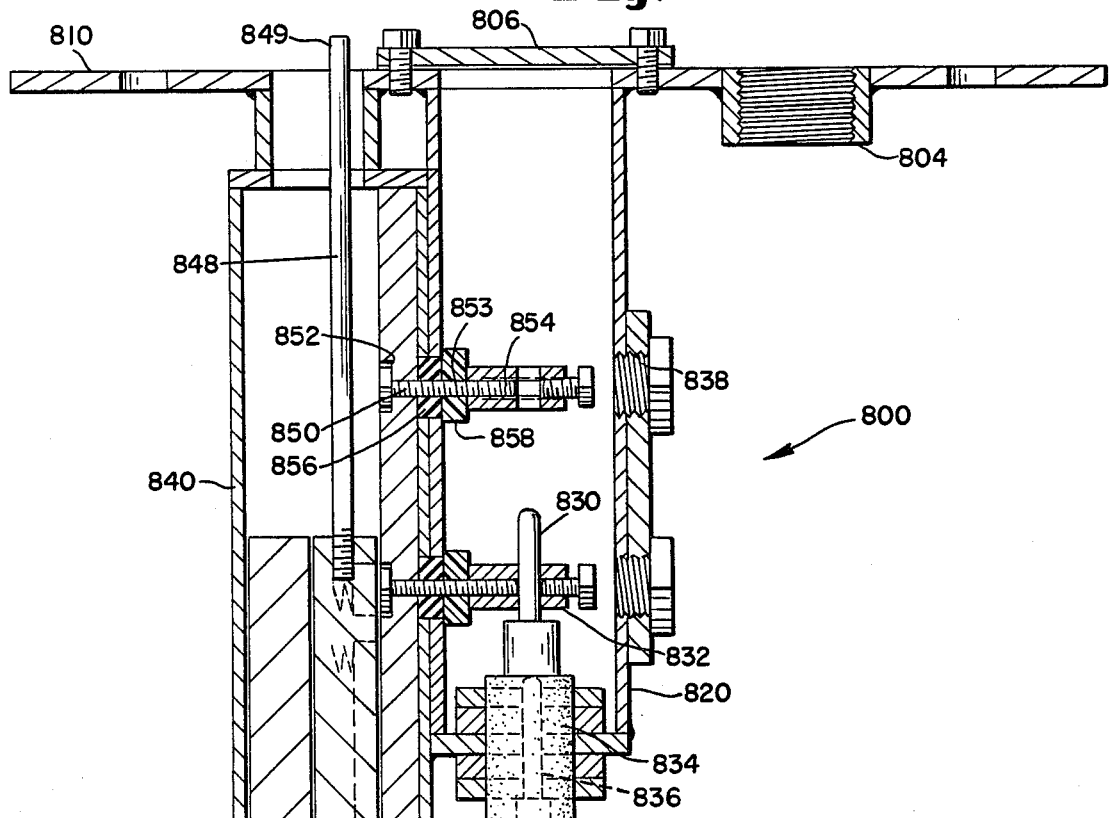
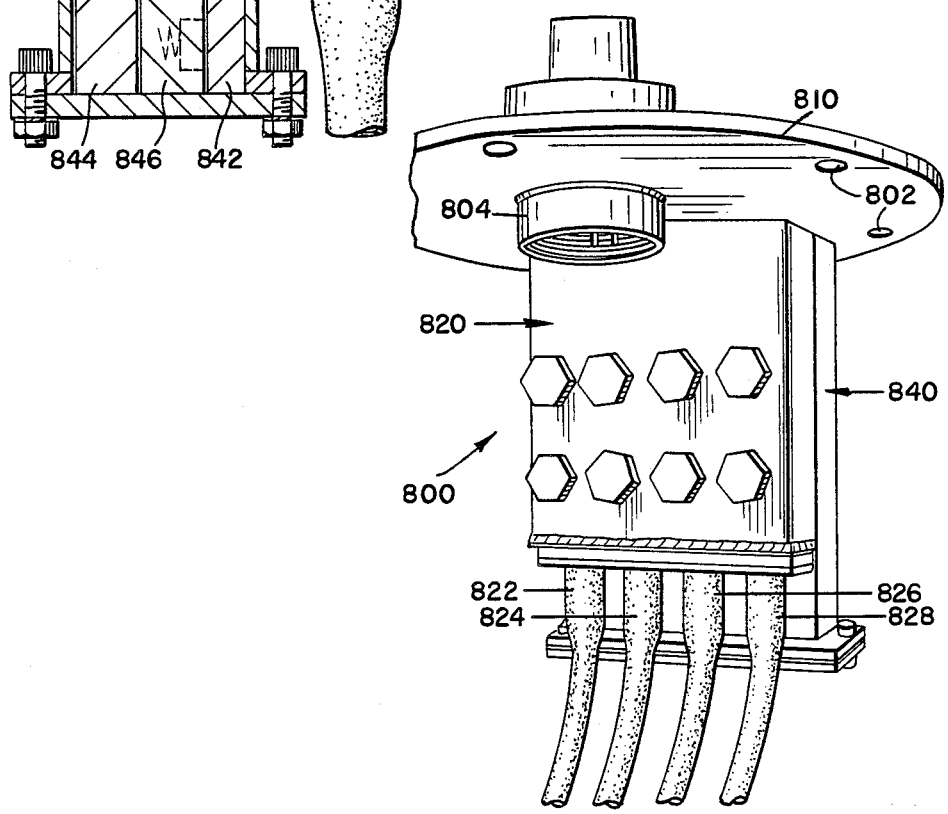

SWITCHING DEVICE FOR A SERIES LOOP CIRCUIT

BACKGROUND OF THE INVENTION

Typically, series loop circuits consist of a plurality of power driven components connected in series with one another, and in series with a power source through a power line. In such series loop circuits, the failure of one power driven component can result in a complete shut down of the entire series loop. Thus, a break in the power line segments between components or a failure of a given component in the loop will result in a loss of power to all of the components in the loop.

An exemplary use of a series loop circuit is in an airport or taxiway lighting system. In such a system, each power driven component includes an isolation transformer and a lighting fixture. The isolation transformer has a primary side connected in series with the power line and a secondary side connected with the lighting fixture. Power from a power source is supplied to each component through the primary side of its respective isolation transformer, and all the components in the series loop circuit have their transformer primary sides connected in series. Typically, when the primary side of an isolation transformer or its connectors, fails, power to the remainder of the power driven components is cut off.

Series loop circuit arrangements and installations in this field of use as are presently known have a number of disadvantages. First, the failure of one primary circuit component will shut down the entire loop system. Second, when such loop circuits shut down, determination of the location of the system fault is most difficult. Third, replacement or repair of faulty system primary circuit components, once located, without interrupting the supply of power to the remaining components of the loop, is difficult if not impossible. Fourth, preventive maintaintance and determination of repairs required in short sections of the underground system is most difficult.

Thus, in a conventional series loop circuit system, maintenance is both time consuming and costly. When such a system breaks down, discovery of the system fault, or routine maintenance, is difficult to carry out without prolonged interruption of power to the entire system. In addition since the maintainance procedure is most difficult, the repairs of the system have not been made on the highest quality level, and the gradual deterioration of the system is very likely and the reliability and maintainability of the system over a period of time and prematurely has declined significantly.

SUMMARY AND OBJECTS OF THE INVENTION

Accordingly, it is a primary object of the present invention to provide a switching mechanism which will overcome all the deficiencies of the known, conventional systems, and which will facilitate maintaining a series loop circuit in good repair.

Another object of the present invention is to provide a switching device that permits bypassing a faulty component of the series loop circuit so as to continue the operation of the remaining components of the loop.

Still another object of the present invention is to develop a method of installing and using a switching device of the type disclosed herein in a series loop circuit to simplify the maintenance of such a loop circuit.

Yet another object is to provide test equipment to evaluate the condition of, or repairs required to correct faults in, short sections of the entire loop of a power line installed underground.

Still another object is to provide means for accessing the primary circuits of an assemblage of series-connected power driven components without having to open or remove the components, or disconnect or destroy the connection at component connectors.

These and other objects of the present invention are realized by electrically coupling a switching device in accordance with the present invention to at least one of a plurality of power driven components in a series loop circuit, wherein the switching device comprises first connection means for a power line of the series loop circuit, second connection means for a power driven component of the series loop circuit, and means for selecting one of a plurality of switch positions, wherein each switch position corresponds to a switching mode which defines a connection relationship between the power line and the power driven component.

The switching device of the present invention further includes test terminal means for connecting test equipment to the switching device. The switching device of the present invention includes a plurality of switch positions, and means for selecting a switch position so that connections between selected ones of the power line, the primary circuit of the power driven component and the test terminal means will be facilitated.

The plurality of switch positions in each switching device includes a first switch position for providing power to the primary circuit of the power driven component to maintain normal operation of the series loop circuit, a second switch position for bypassing an electrically defective power driven component without an interruption of power to other power driven components in the series loop circuits, and at least one other switch position for utilizing test equipment.

A method for utilizing the switching device of the present invention includes establishing selectable connections between the switching device, the power line, the power driven component and testing apparatus, and selecting an appropriate switch position to effect one of a first connection in which the primary circuit of the power driven component is electrically coupled with the power line of the series loop circuit, a second connection in which the power driven component is electrically isolated from the power line of the series loop circuit i.e., bypassed, and at least one other position in which the system is temporarily shut down while the power driven component, the power line and the testing apparatus are electrically coupled to determine breaks, deteriorations or grounds in the power line of the series loop circuit or in the primary circuit of the power driven component such as at transformers and connectors.

Further applications and uses of the present invention will become apparent from the detailed description given hereinafter. However, it should be understood that the detailed description and specific examples, while indicating preferred embodiments of the invention, are given by way of illustration only since various changes and modifications within the spirit and scope of the invention would be apparent to those skilled in the art from the following detailed description.

BRIEF DESCRIPTION OF THE DRAWINGS

FIG. 20 illustrates a cross-sectional side view of a third embodiment of the switching device;

FIG. 21 is a perspective view of the switching device shown in FIG. 20;

DETAILED DESCRIPTION OF THE PREFERRED EMBODIMENTS

Figure 1:
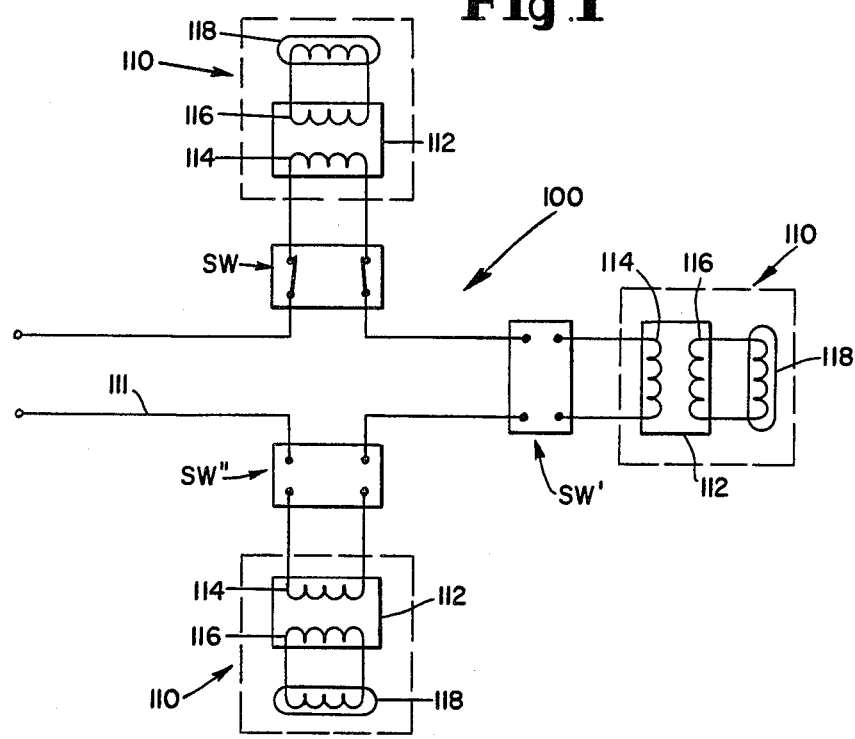
FIG. 1 is a schematic wiring diagram for a series loop circuit including three power driven circuit components connected in series, with a switching device set in a unique mode of operation, according to the present invention, being electrically coupled between each circuit component and the power line of the series loop circuit.

FIG. 1 illustrates a series loop circuit 100 of the type which is typically used in an airport runway lighting system. Three switching devices SW, SW', SW''', embodying the principles of the present invention are shown electrically coupled with each of the power driven components 110. The three power driven components 110 are connected in series by means of a power main or line 111. Each power driven component 110 of a runway lighting system includes an isolation transformer 112 and an active element 118, such as a lamp. The transformers 112 each include a primary winding 114 and a secondary winding 116, and the switching devices SW, SW', SW'' are connected between the primary winding of the transformer and the power line 111 so as to maintain continuity of the series loop circuit. The switching devices SW, SW' and SW'' are preferably structurally identical, with each switching device illustrated in FIG. 1 being set in a unique switching position to perform a unique switching function. The positions and respective functions of the three switching devices SW, SW' and SW'' will be described below.

In a typical series loop circuit in which no switching devices are provided, a failure of one of the power driven elements results in a failure of the entire series loop circuit.

A switching device in accordance with the present invention provides the capability of connecting a power driven component to the main series loop circuit via a NORMAL switch position, of bypassing the power driven component via a BYPASS switch position, or of testing the primary circuit elements of the power driven component via a TEST switch position assumed. The switch selection capabilities of each disclosed embodiment of the switching device in accordance with the present invention will be described below following a detailed description of each of the embodiments of the present invention.

I. THE EMBODIMENT OF FIGS. 2-7

Figure 2:
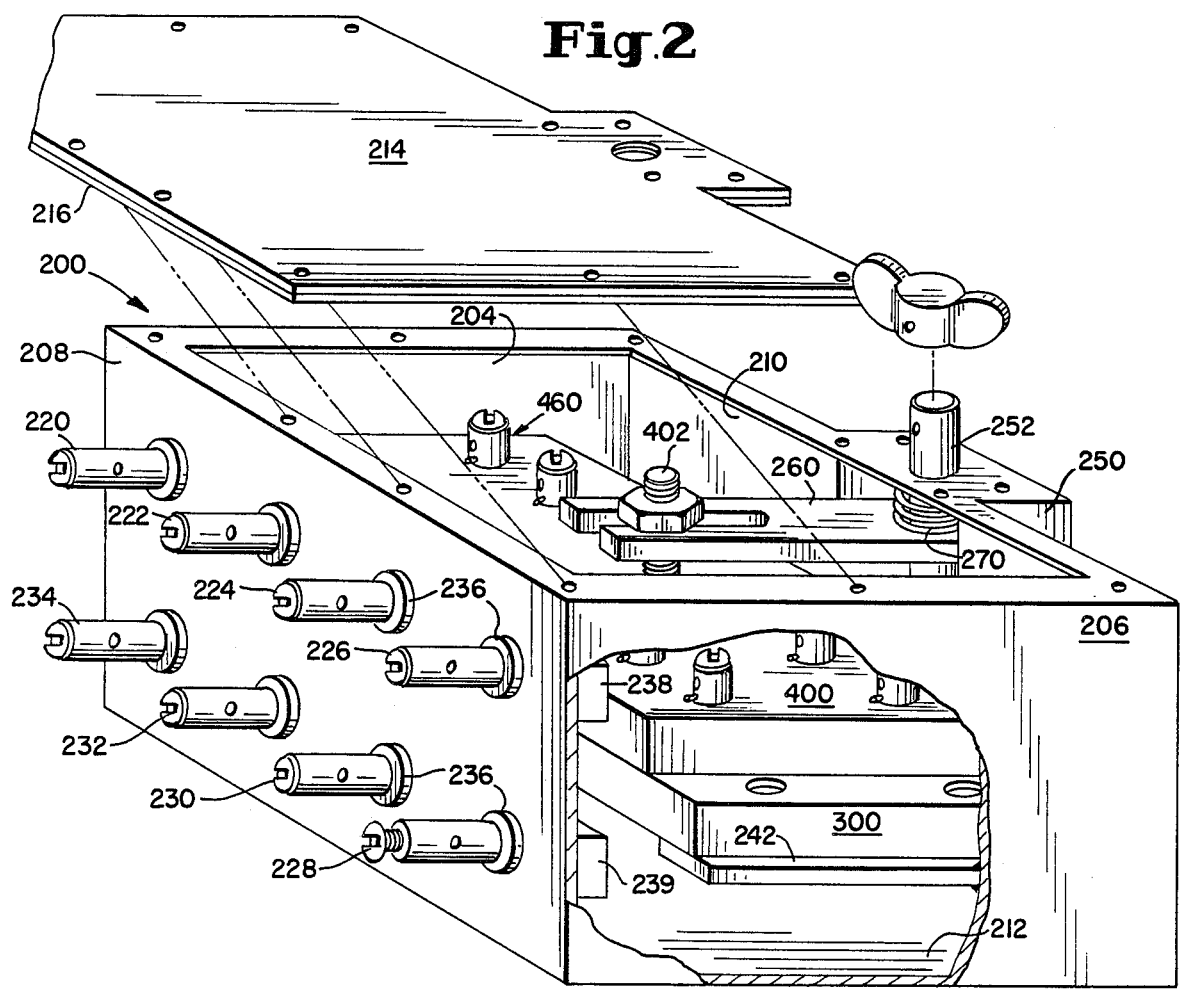
FIG. 2 is a perspective view of a first embodiment of the switching device of the present invention.

FIGS. 2-7 illustrate a first embodiment 200 of the switching device of the present invention. FIG. 2 shows the switching device 200 to include a housing having end walls 204, 206, a front wall 208, a rear wall 210, a bottom or lower wall 212 and a top or upper wall 214. The bottom wall is secured to the lower side of the housing while the top wall is securable to and against the upper faces of each of the front, rear and end walls in order to permit the removal of the top wall for access to, and servicing of, the elements in the interior of the housing. In use, the housing interior of the switching device will preferably be filled with oil to facilitate movement of relatively displaceable parts, and to retard moisture formation. Therefore when securing the top wall in place, a seal or gasket 216 is interposed between the top wall and the upper faces of the front, rear and end walls to prevent leakage of the oil from the housing interior.

A plurality of horizontally disposed terminals 220-234 extend through apertures in the front wall 208 of the housing. While the terminals shown in FIG. 2 are arranged as an array of two horizontal, parallel rows of four terminals in each row, other arrangements of the terminals are possible and such arrangements may be determined by considerations such as availability of space, cost, degree of miniaturization feasible, etc. The front ends of each of the terminals are fitted with conventional terminations used for connection to cables or conductors. Each of the terminals extending rearwardly through the housing front wall apertures are electrically insulated from the front wall by insulator bushings 236 mounted in the apertures. Elongated insulating members 238 and 239 are mounted parallel to, and rearwardly of, the rear side of the housing front wall. The rear portions of the upper row of terminals 220, 222, 224, 226 are secured in the upper insulating member 238. The rear portions of the lower row of terminals 228, 230, 232, 234 are secured in the lower insulating member 239. Each terminal is fitted at its rearmost end with a termination similar to the terminations provided at the front end of the terminals. Secured to each end wall 204, 206 of the housing and located between the housing front and rear walls is a shelf 240, 242. Each shelf extends in a direction parallel to the end wall a distance equal to at least one half the distance between the front wall and the back wall. Secured to the upper surfaces of, and spanning the distance between, the shelves 240, 242 is a lower contact block 300. An upper contact block 400 is seated on, and supported by, the top surface of contact block 300. Each of the contact blocks is formed of a material having good electrically insulating properties e.g. Delrin 507.

Figure 4:
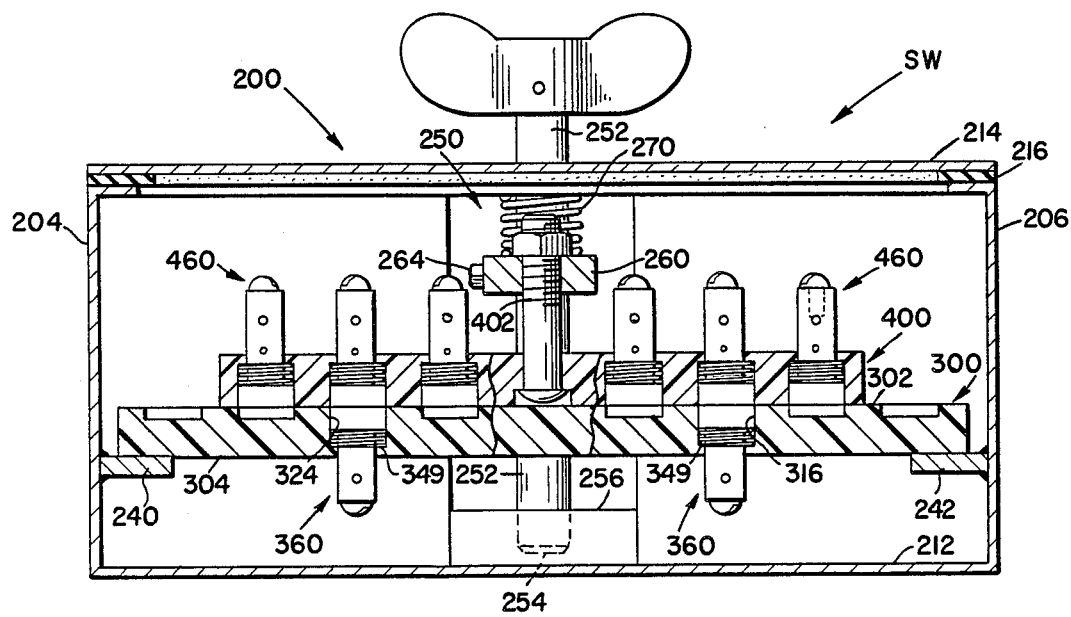
FIG. 4 is a partial sectional view of the switching device of FIG. 2 taken along section lines 4—4 in FIG. 3.
Figure 5:
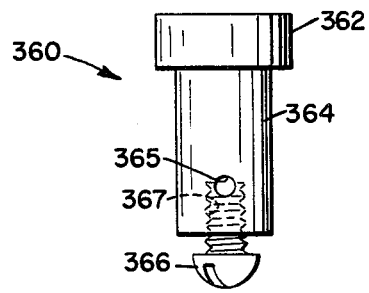
FIG. 5 is a side view of a contact pin of the type mounted in the lower contact block 300.
Figure 6:
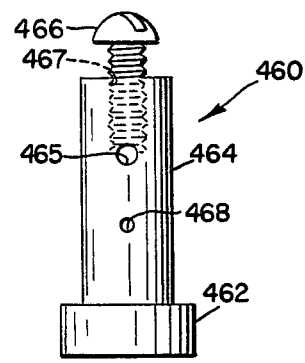
FIG. 6 is a side view of a contact of the type mounted in the upper contact block 400.

Contact block 300 preferably is formed with a length approximately equal to the distance between end walls 204 and 206 and a width of a dimension less than or equal to the width of the shelves 240, 242. Contact block 300 is formed with two parallel rows 310 and 330 each consisting of nine equidistantly spaced bore holes 312–328 and 332–348, respectively. Each row of bore holes is shown extending substantially perpendicular to the end walls of the housing. In each row, the third bore holes 316, 336 and the seventh bore holes 324, 344 penetrate through the entire thickness of contact block 300 from the top surface 302 to the bottom surface 304 as shown in FIG. 4. Each of the remaining bore holes may constitute through holes or optionally may only extend partially through the thickness of the contact block 300 a predetermined distance d from the top surface 302. Each of the bore holes 316, 324, 336, 344 which penetrate the thickness of contact block 300 includes an upwardly facing, radially inwardly extending annular shoulder 349. A contact 360, having a base 362 and a neck 364, is positioned in an inverted manner in each of the bore holes 316, 324, 336, 344 with the base 362 of each contact being supported the above shoulder 349. Neck 364 of each contact is formed with a transversely extending bore 365, and the threaded shank of a clamping screw 366 is received in a threaded opening 367 extending axially of the contact neck at the end of the contact neck 364 remote from the contact base 362. It is to be understood that when making connection between the contact 360 and a conductor, the latter with be inserted through the transversely extending bore 365 and the threaded fastener 366 will be threaded into the opening 367 toward the transversely extending bore 365 so that the end of the fastener approaching the bore 365 clamps the conductor therein. It is further to be understood that terminations of other types, such as those commonly known and used in the electrical arts, may be employed as well to accomplish the conductor-to-contact connection.

The contacts are positioned in each bore hole 316, 324, 336, 344 with the uppermost surface of the base 362 located below the top surface 302 of contact block 300 and the termination 366 extending downwardly, and away, from the bottom surface 304 of contact block 300. A pair of vertically extensive pins or guide members 306, 308 are secured in the contact block 300 in opposite end regions thereof. Each pin or guide member includes a first end secured via molding upon formation of block 300 or via a screw-threaded connection in the insulating material and a second end extending above the upper surface 302 of the contact block 300 to a predetermined height h the purpose of which will be described below.

Figure 7:
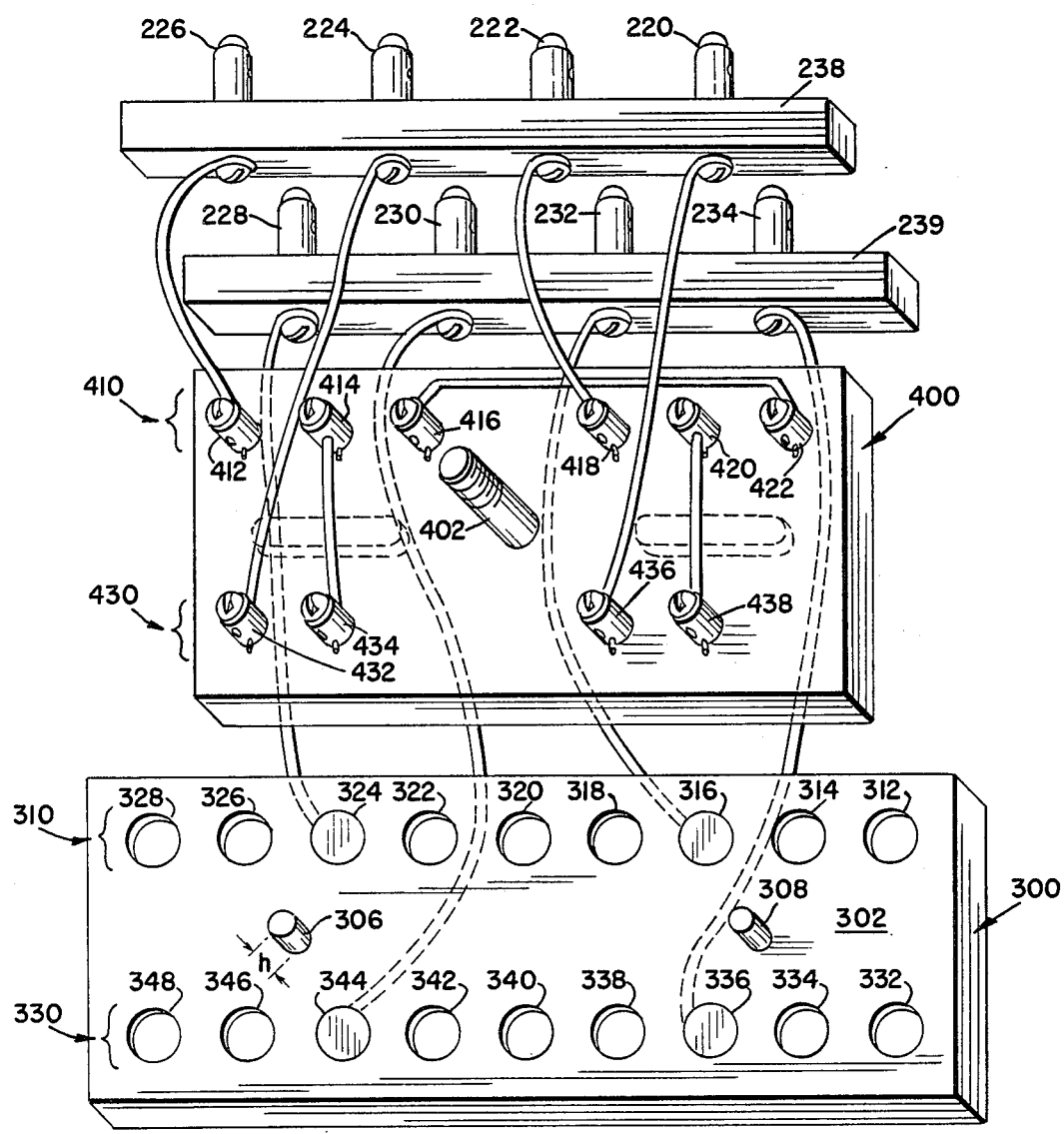
FIG. 7 is an exploded view of the principal elements constituting the switching device shown in FIG. 2 and the electrical connections between the illustrated elements.

Contact block 400 is supported on the upper surface of contact block 300 and is preferably formed with a width and thickness substantially equal to the width and thickness of contact block 300, and a length less than the length of contact block 300. As shown in FIGS. 4 and 7, the length of contact block 400 is such that when contact block 400 is centered over contact block 300, all bores of contact block 300 are covered with the exception of the outermost bores 312, 328, 332, 348. This difference in lengths between the two contact blocks facilitates displacement of the contact block 400 from side to side relative to the fixed lower contact block 300 so that an appropriate switching function to be described below can be effected.

Mounted in the center of contact block 400 is a vertically extending linkage shaft 402. Shaft 402 extends upwardly from the lower surface of contact block 400 through a bore to terminate in a shaft end portion located above the top surface of the block 400. A base portion of the shaft is preferably anchored in an upwardly recessed portion of the bore so that the lower end of the shaft does not project from the bore and thus does not contact any portion of block 300.

Figure 3:
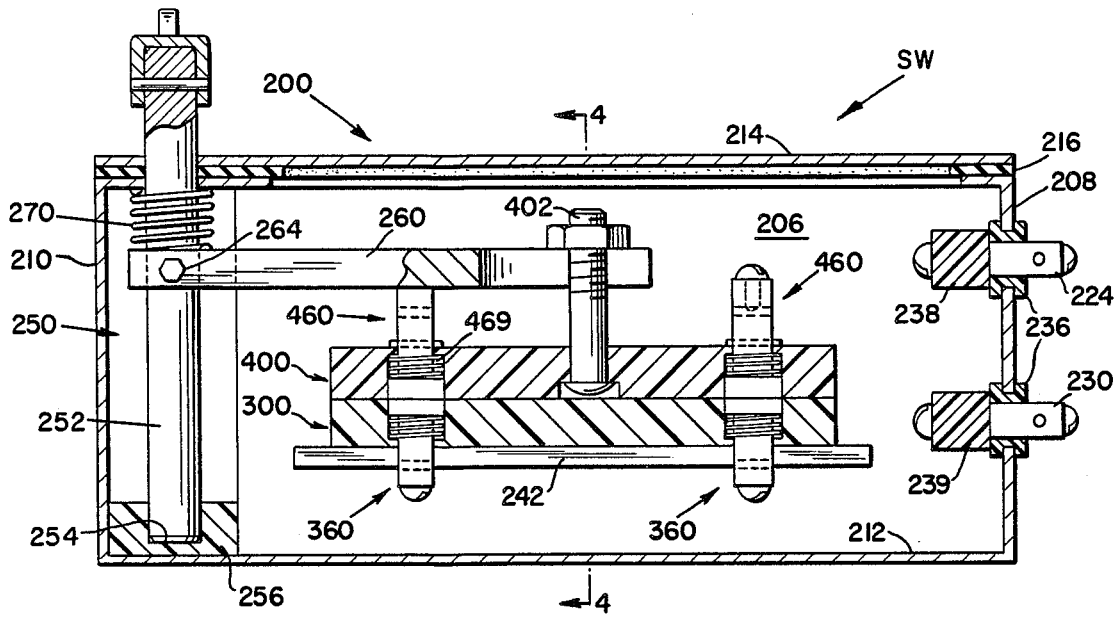
FIG. 3 is a side sectional view of the switching device of FIG. 2.

Contact block 400 further includes two, substantially parallel rows 410, 430 of apertures which correspond with the rows 310, 330 of bore holes in contact block 300 and which extend through contact block 400 from its top surface to its bottom surface. The apertures are disposed in identical groupings on opposite sides of the shaft 402 and contact pins 460 are positioned in each of the apertures. Contact pins 460, which are substantially identical in structure to one another and to contacts 360 disposed in contact block 300, all include a base 462, a neck 464, a first transversely extending bore 465, an axially extending threaded opening 467 at the free end of neck 464 communicating with bore 465, a threaded clamping member 466 and a second transversely extending bore 468 disposed in neck 464 between first bore 465 and the base 462. Clamping member 466, in a manner similar to that described above in connection with clamping member 366 of contact 360, can be threaded into opening 467 and into clamping engagement with a conductor which has been inserted through bore 465 to ensure a firm mechanical and electrical connection between contact pin 460 and the inserted conductor. As shown in FIGS. 3 and 4, each contact pin 460 is mounted in a respective aperture in contact block 400 by insertion of the pin upwardly through the aperture such that the lower portion of the base 462 is disposed adjacent the lower surface of contact block 400. A helical spring 469 is disposed coaxially about the neck 464 of the contact pin 460. Upon insertion of the contact pin in the aperture, the spring 469 is located between the annular flange of base 462 and a corresponding annular flange within the aperture. Spring 469 is provided to urge base 462 (and thus the contact pin 460) downwardly and out of the aperture. Each contact pin 460 is maintained in its respective aperture at a position which assures the disposition of the first bore 465 above the top surface of contact block 400. This is accomplished by the insertion of a pin or wire w through the second bore 468 at a location just above the top surface of contact block 400. By this arrangement of the pin or wire and second bore 468, the spring 469 is held in compression so that the contact pin 460 is normally urged toward the bottom surface of the contact block 400 to such an extent as to cause a lower portion of base 462 to normally project beyond the lower surface of contact block 400 the purpose of which will be described below in connection with the operation of this embodiment.

Referring again to FIGS. 2-4, the housing rear wall 210 includes a rearwardly projecting chamber 250 located substantially midway between the end walls 204 and 206. Located substantially centrally in the chamber is a vertically extending pivoting shaft 252 rotatable about its longitudinal axis. The bottom end of shaft 252 is disposed within, and supported by, a bore 254 in bearing block 256, while the upper end of the shaft projects upwardly through a bearing in the top wall above the chamber and carries a handle means at its uppermost portion. A linkage arm 260 extends substantially horizontally from pivot shaft 252 to the linkage shaft 402 carried by, and centrally of, the contact block 400. The rear end portion of linkage arm 260 is secured to a middle portion of pivot shaft 252, as for example by a bolt 264, and the forward end portion of linkage arm 260 is formed as a fork. The upper portion of the linkage shaft 402 is received between the arms of the fork, and the fork is secured to the linkage shaft by a bolt carried by shaft 402. A spring or biasing element 270 is positioned on the shaft, preferably between the housing top wall and the upper surface of the linkage arm.

Figure 8:
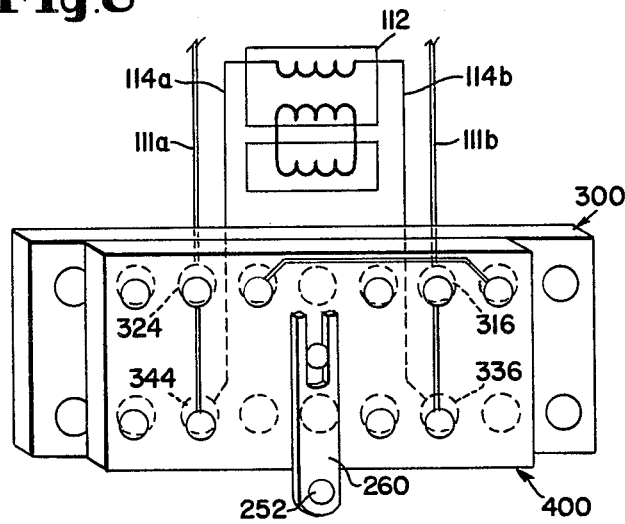
FIG. 8 is a schematic diagram of the first embodiment of the switching device when set in a NORMAL operating mode.
Figure 9:
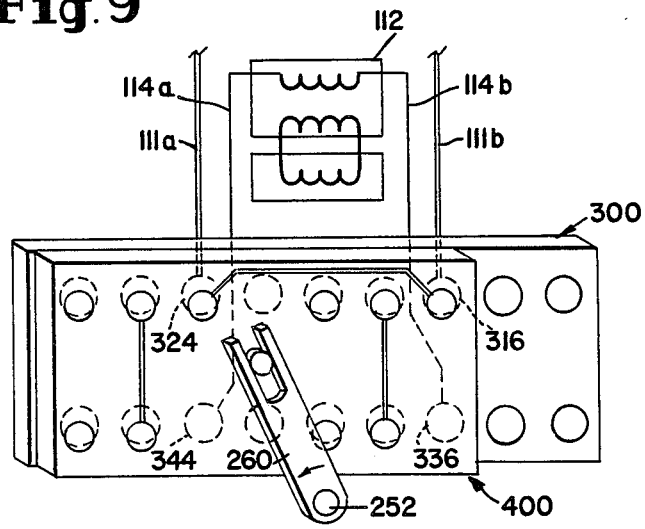
FIG. 9 is a schematic diagram of the first embodiment of the switching device when set in a BYPASS mode of operation.
Figure 10:
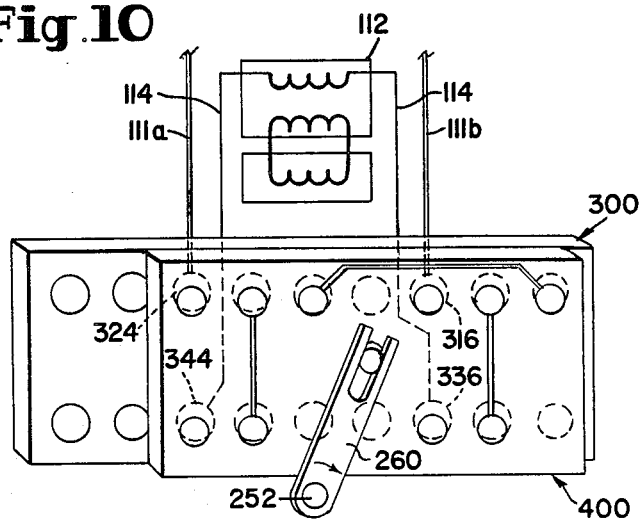
FIG. 10 is a schematic diagram of the first embodiment of the switching device when set in a TEST mode of operation.

In each of FIGS. 8-10, the "input" side 111a of power line 111 is shown to be electrically coupled to the contact in bore 324 and the "output" side 111b of power line 111 is electrically coupled to the contact in bore 316 in contact block 300. The transformer primary is shown to be electrically coupled to the contact 34 in bore 341 while the "output" side 114b of the transformer primary is shown to be electrically coupled to contact in bore 336.

FIG. 8 illustrates the relative positioning of contact blocks 300 and 400 corresponding to the NORMAL mode of operation, and shows that an electrical circuit has been established between power line 111 and the primary of transformer 112 by virtue of the positioning of the electrically connected contacts disposed in the pairs of apertures 414, 434 and 20, 438, carried by contact block 400, atop the contacts disposed in the pairs of apertures 324, 344, 316, 336, carried by contact block 300.

FIG. 9 illustrates the relative positioning of contact blocks 300 and 400 corresponding to the BYPASS mode of operation, and shows that an electrical circuit has been established between the "input" and "output" leads 111a and 111b of the power line 111 by virtue of the positioning of the electrically connected contacts located in the pair of apertures 416, 422 in contact block 400 atop the contacts disposed in the apertures 324 and 316 in contact block 300.

FIG. 10 illustrates the relative positioning of contact blocks 300 and 400 corresponding to the TEST mode of operation, and shows that no electrical circuit has been established, either between the power line leads 111a and 111b, or between the power line leads and the leads from the primary of the transformer.

As shown in FIG. 8, the linkage arm 260 carried by pivot shaft 252 is disposed in a position in which it extends substantially normal to the fixed contact block 300 and hence substantially normal to the rear wall 210 of the switching device housing. In order to change the relative positioning of contact blocks 300 and 400 from that positioning shown in FIG. 8, it is necessary first to raise pivot shaft 252 upwardly to cause disengagement of the base of contact pins 460 carried by contact block 400 from the apertures in contact block 300 thereby effectively disengaging contact block 400 from contact block 300, and then to rotate pivot shaft 252 about is longitudinal axis either (1) in a counterclockwise direction so that contact block 400 moves, relative to contact block 300, to the position shown in FIG. 9, or (2) in a clockwise direction so that contact block 400 moves, relative to contact block 300, to the position shown in FIG. 10.

II. THE EMBODIMENT OF FIGS. 11-19

Figure 11:
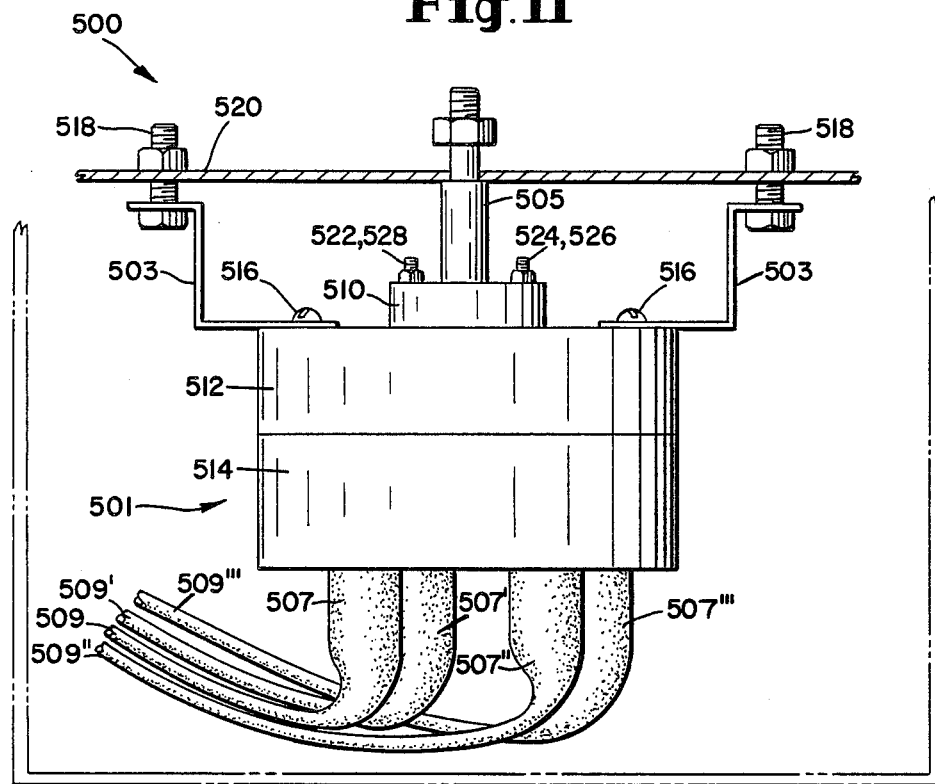
FIG. 11 is a side view of a second embodiment of the switching device of the present invention.
Figure 12:
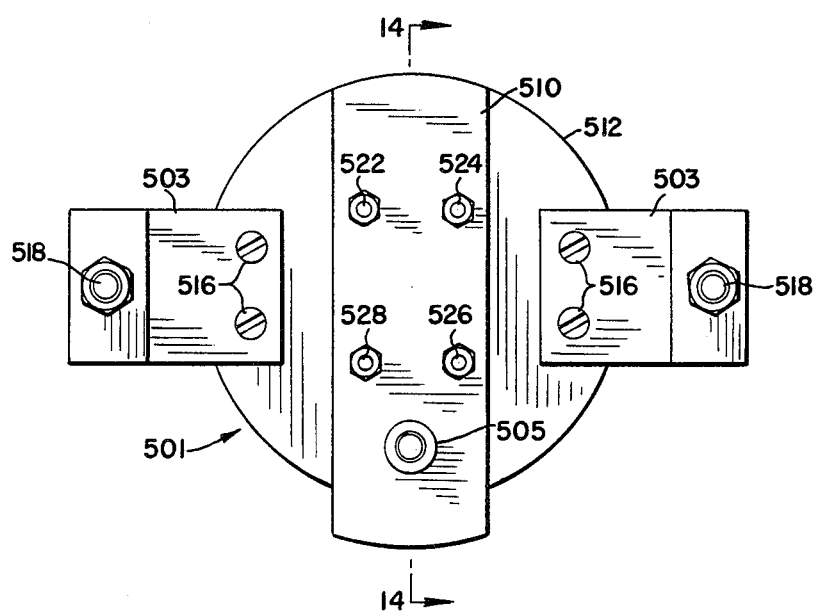
FIG. 12 is a top view of the switching device of FIG. 11.
Figure 13:
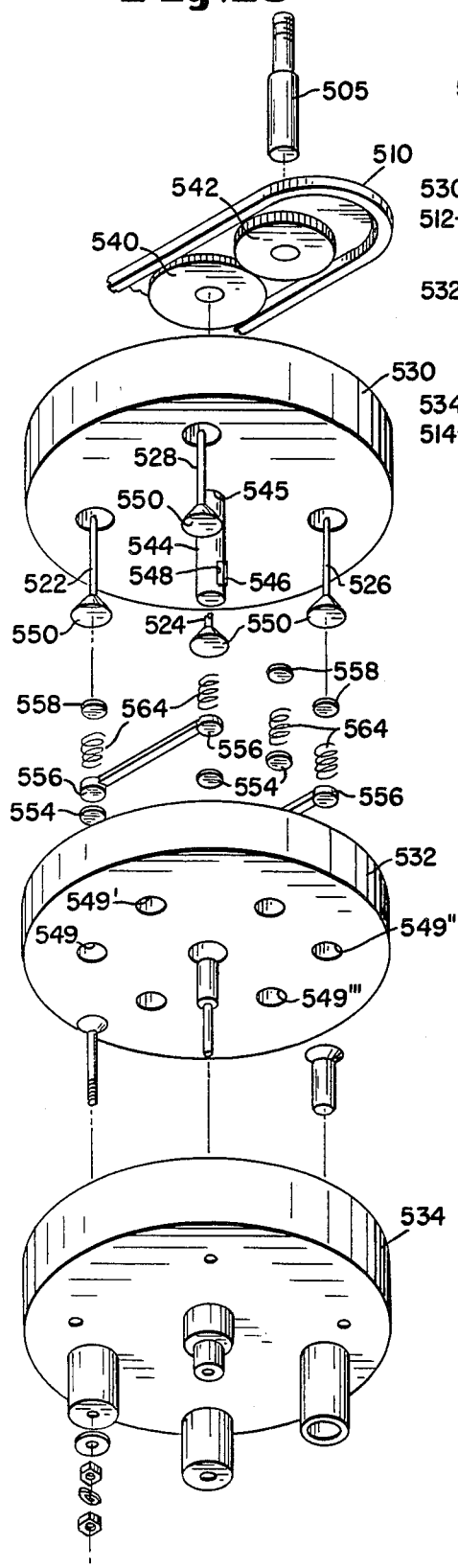
FIG. 13 is an exploded perspective view of the switching mechanism carried within the switching device of FIG. 11.
Figure 14:
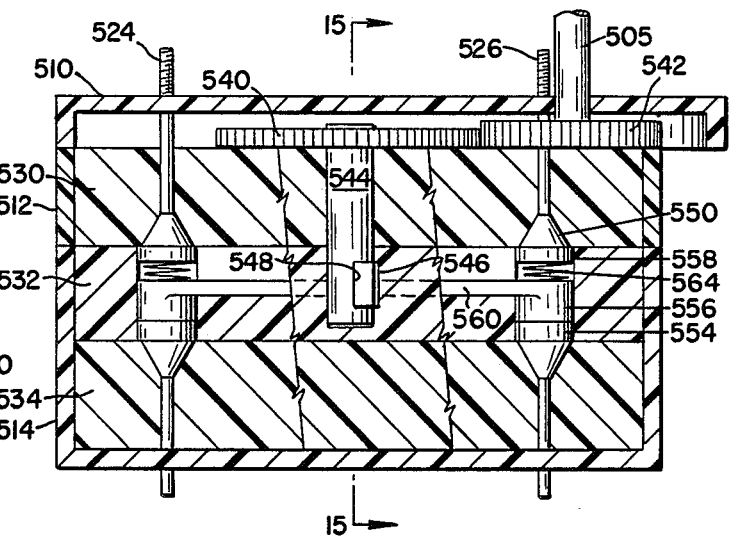
FIG. 14 is a cross-sectional view of the switching device of FIG. 11.

FIGS. 11-19 illustrate a second embodiment 500 of the switching device of the present invention which, as seen more particularly in FIGS. 11 and 12, includes a switch housing 501 having an upper insulated housing member 510, a central insulated housing member 512 and a lower insulated housing member 514. The central and lower housing members are preferably symmetrical and include coaxial centrally located axes of symmetry. Brackets 503 are provided to support the switch housing 501 along with the transformer of the power driven component, within a container which is typically embedded within the ground. The brackets are secured at one end to the upper surface of upper housing member 510 via fasteners 516, and are secured at an opposite end via fasteners 518 either to the side wall of the container or, as shown in FIG. 11, to the container cover 520. The container cover provides support for auxilary devices such as the lamp in the runway or taxiway lighting system. A rotatable switching shaft 505 described below in greater detail extends from the interior of switch housing 501 upwardly through and above cover 520 of the container. The uppermost end of the switching shaft is adapted for connection to a handle not shown, as for example by being provided with ribbing or threads. In this way, the shaft can be rotated via manipulation of the handle to determine relative switching positions of contact elements carried within the switch housing, which in turn will determine the connection relationship between the power driven component and the power main of the series loop circuit. As shown in FIG. 12, shaft 505 is preferably eccentrically disposed relative to the central axis of switch housing 501. Such placement of the shaft 505 facilitates changing the relative positions of the contact elements carried within the housing by manipulation of the handle from a location outside the housing and remote from the cover plate.

Electrical connection of the switching device to the primary circuit of the power driven component, as well as to the power line of the series loop circuit, is facilitated, via connectors 507, 507', 507" and 507''' and conductors 509, 509' and 509''' respectively, at the underside of the switch housing 501.

Testing of the primary circuit of the power driven component is accomplished in a manner to be described below via test connection terminals 522, 524, 526, 528, which extend downwardly through the upper housing member 510 into the interior of the switching device. Each test connection terminal includes a nut and washer assembly preferably made of brass, and may be provided with a cover made, for example, of nylon.

Housed within the central and lower housing members 512 and 514, respectively , are three cylindrical, electrically insulated contact blocks: an upper contact block 530, a center contact block 532 and a lower contact block 534.

Supported atop the upper contact block 530 is the upper housing member 510. A rotatable driven gear 540 and a rotatable driving gear 542 intermeshed with the driven gear 540, are located within housing member 510. Switching shaft 505 is secured at the center of the driving gear 542. A key shaft 544 extends downwardly from the driven gear through a bore 545 in upper contact block 530 and is secured in the center contact block 532. Bore 545 is of greater diameter than the diameter of shaft 544 to permit free rotation of the shaft relative to contact block 530 when the shaft is rotated. The lower end portion of shaft 544 includes a key element 546 affixed within, and extending radially from, a key slot 548. The key shaft 544 is fixed at the central region of the driven gear 540. The upper contact block 530 also supports test connection terminals 522, 524, 526, 528. Each test connection terminal includes a lower inverted conical section 550 having a contact face which is preferably ground and polished. The test connection terminals are disposed in the upper contact block 530 at locations equidistant from one another and from key shaft 544.

Center contact block 532 is made to rotate relative to the upper and lower contact blocks upon rotation of the key shaft 544, center contact block 532 includes four contact terminal bores 549, 549', 549'', 549''' disposed equidistantly from one another and from the central axis of symmetry of contact block 532. Two additional contact bores 550, 550' are provided in contact block 532. Each additional bore is located between one pair of a set of three terminal bores, with each additional bore further being spaced from the central axis of block 532 the same distance as each of the terminal bores. The upper side of the center contact block 532 presents two parallel grooves 551, 552, with each groove extending between and interconnecting one pair of the contact terminal bores 549, 549', 549'', 549'''. The grooves extend downwardly from the top surface of the center block through a depth of approximately one-half its thickness. The width of the grooves is preferably no greater than the diameter of the contact face of each of the conical sections 550 of the test connection terminals 522, 524, 526, 528. Housed within each of the contact terminal bores is a lower contact button 554, a middle contact button 556, and an upper contact button 558. Conductive strip-like buss elements 560, 562, disposed in grooves 551, 552, respectively, span the distance between, and lie in contact with, the pair of middle contact buttons 556 disposed in the interconnected contact terminal bores. The buss elements 560, 562 each terminate in end portions which overlie and which may be unitary with the middle contact buttons. Disposed between the upper surface of each buss element end portion and the lower surface of the respective upper contact is a spring element 564 which maintains the upper contact at an elevated position within the terminal bore so that firm connection is assured between each of the upper contact buttons 558 and the contact faces of the conical sections of test connection terminals 522, 524, 526, 528 when the upper contact buttons are carried, via rotation of the center contact block 532, into alignment with each of the contact faces of the test connection terminals. The two additional contact bores 550, 550' in center contact block 532 house a lower contact button 554, an upper contact button 558 and a spring element 564 interposed between the upper and lower contact buttons.

Figure 15:
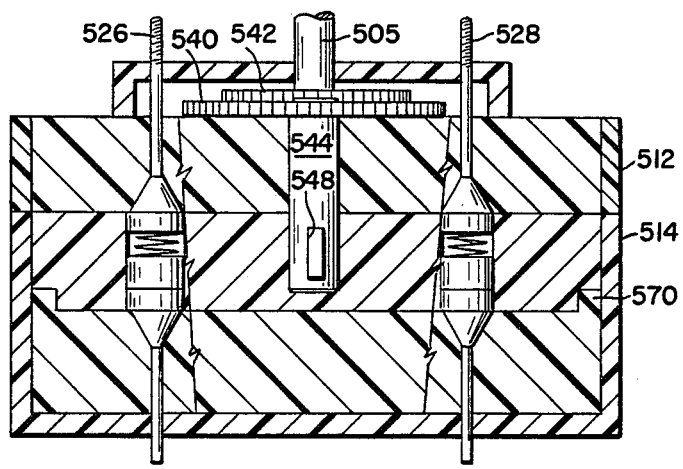
FIG. 15 is a sectional view of the switching device of FIG. 11 taken along lines 15—15 in FIG. 14.
Figure 16:
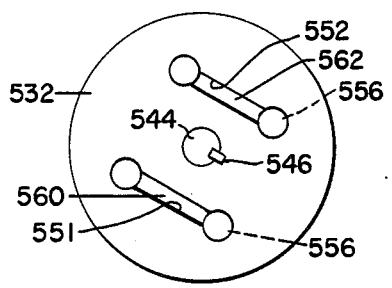
FIG. 16 is a top view of the middle contact block in the switching device of FIG. 14.

While all three contact blocks may have the same external diameter, the lower contact block 534 can also be formed with an upstanding flange 570 as shown in FIG. 15 disposed about the circumference thereof to receive the lower portion of center block 532. Moreover, the center contact block may include a portion formed as a cylindrical boss complimentarily configured with the recess defined within flange 570 so that the center contact block will be guided in its rotational movement when rotated via shaft 544.

Figure 17:
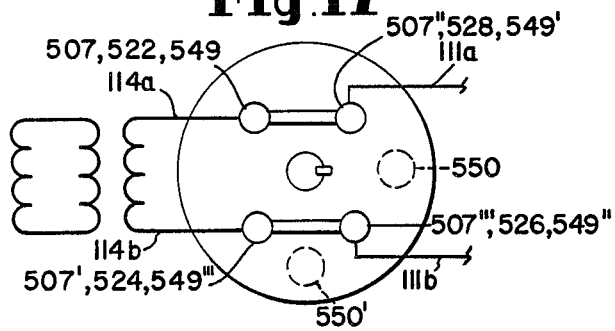
FIGS. 17-19 show the relative positioning of contacts carried by the middle and lower contact blocks in the switching device of FIG. 11 when the switching device is set in the NORMAL, TEST and BYPASS modes of operation, respectively.
Figure 18:
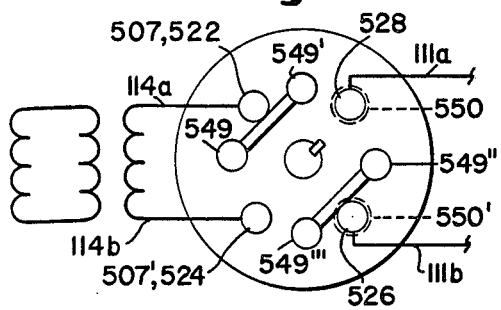
Figure 19:
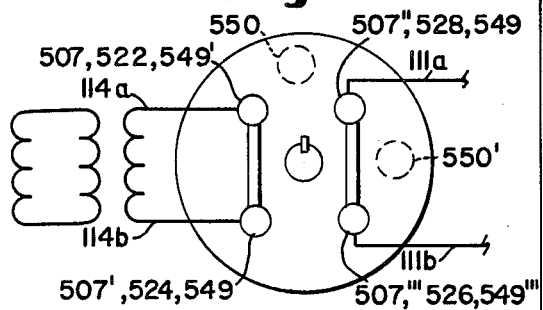

FIGS. 17–19 illustrate three operating positions of which the switching device of this second embodiment is capable of assuming, with FIG. 17 illustrating a NORMAL operating position, FIG. 18 illustrating a TEST operating position, and FIG. 19 illustrating a BYPASS operating position. Each of the Figures also illustrate the input side 111a of power line 111 being connected to contact 507'' and the output side 111b of power line 111 being electrically coupled to contact 507'''. The "input" side 114a of the transformer primary is shown to be electrically coupled to contact 507, while the "output" side 114b of the transformer primary is shown to be electrically coupled to contact 507'.

In the TEST operating position depicted in FIG. 18, test equipment can be connected to external contacts 522, 524, 526, 528 so that testing of the main series loop can be carried out. One method for testing a series loop includes connecting cables to these test points to vary the configuration of the loop. In the TEST operating position of the switch, therefore, the power to the power driven component is actually interrupted, but it can be re-established by connecting the cables to another set of test terminals on a second switching device at a second power driven component of the loop. This allows the user to actually bypass certain components in the loop by isolating one power driven component from the series loop to carry out desired testing on that one power driven component.

III. THE EMBODIMENT OF FIGS. 20–23

FIGS. 20–23 illustrate a third embodiment 800 of the switching device of the present invention which comprises a cover plate 810, a test contact housing 820, and a switching contact housing 840. This embodiment of the switching device may be mounted within a container buried in the ground, or optionally may be secured to a stake implanted in the ground.

To achieve mounting of the switching device within a buried container, a plurality of through openings 802, are provided at preselected intervals adjacent the circumference of the cover plate so that the entire switching device may be disposed within, and secured to the top end of, the in ground container. Alternatively the openings could be used to attach the switching device to a plate or fixture secured to a stake. The cover plate 810 also includes a threaded lamp socket 804 for attachment to a lighting fixture, the lamp socket being formed preferably on the side of housing 820 opposite housing 840. An access plate 806 is removably secured to, and covers an opening atop the test contact housing in, the cover plate 810 to permit access to the terminals in housing 820 so that testing of the circuit component to which the switching device is coupled and the power main can be quickly accomplished.

Housing 820 has a bottom wall in which are secured four conductive terminals 822, 824, 826, 828 for interconnection with upstream and downstream leads from the circuit component primary side and the power main. Each of the terminals includes a male end 830 for connection with coupling elements 832 having structure and function similar to those shown in FIG. 5 of the drawings, and a female end 834 for receipt of, and connection with, conductor terminations 836. Each of the terminals 822, 824, 826, 828 are secured in an opening in the bottom wall of housing 820 from above and below with a fastener assembly which preferably includes at least one washer and at least one sealing means. Access openings 838 normally closed with plugs or bolts as shown in FIG. 20 are provided on the rear wall of housing 820 to permit tightening of the threaded screw clamps, carried at the rear ends of the couplings, against cables or pins which have been inserted transversely into the coupling elements 832.

Switching contact housing 840 is formed with exterior walls which are joined together e.g. via welding to define a sealed interior space. The interior space is filled with oil to facilitate movement of relatively displaceable parts and to retard moisture formatoin e.g. via condensation. Housing 840 contains stationary contact plate 842, a vertically slidable contact plate 846, and a backing member 844 which is fastened to the forward side of the slidable contact plate 846. Contact plate 842 is affixed against the rear wall of housing 840 via two horizontal rows of contact pins only one contact pin in each row shown in FIG. 20 which are carried by the contact plate in parallel, and which are secured by the coupling elements 832 contained within housing 820. The contact plate 842 preferably has a vertical extent height substantially equal to the vertical extent height of the interior of housing 840, while contact plate 846 and backing plate 844 have vertical extents heights which are substantially equal, and further extend vertically at least one-half the height of contact plate 842.

An actuator shaft 846 extends from the upper region of slidable contact plate 842 in which the shaft is secured upwardly through a guide aperture at the top of housing 840 and terminates in an upper end portion 849 disposed above cover plate 810. Markings are preferably provided on the actuator shaft at predetermined locations to designate, for the benefit of an operator, lengths of upward travel of the shaft corresponding to three different positions of the slidable contact plate 846 relative to the stationary contact plate 842; a first position corresponding to the NORMAL mode of operation of the switching device, a second position corresponding to the TEST mode of operation of the switching device, and a third position corresponding to the BYPASS mode of operation of the switching device.

Each of the contact pins carried by stationary contact plate 842 include a base portion 850 disposed in a recessed seat 852 formed on the front side of the stationary contact plate and a shank portion 853 extending rearwardly through the abutting rear and front walls of housings 840 and 820, respectively. Each contact pin terminates in an end portion 854 located within housing 820, and each end portion 854 is provided with an external thread. Seal means 856 and washer means 858 are disposed on the end portion 854 of each contact pin adjacent the forward wall of housing 820 before being threadedly coupled with the internally threaded coupling elements 832, which when screwed on the externally threaded end portions of the contact pins against the rear face of the forward wall of housing 820, have the effect of securing the stationary contact plate 842 against the rear wall of housing 840.

Figure 22:
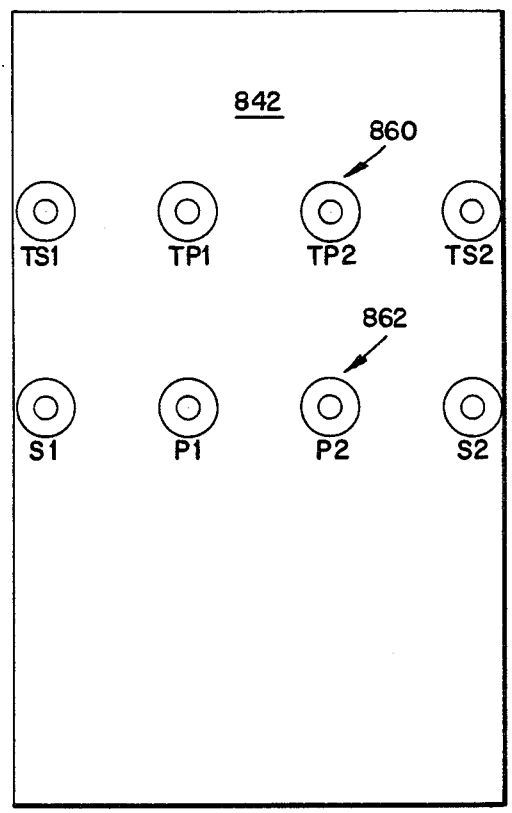
FIG. 22 depicts the contact arrangement carried by the fixed contact plate 842 shown in FIG. 20.

As shown in FIG. 22, the contact pins carried by stationary contact plate 842 are arranged in two horizontally extensive, parallel rows, and within each row the contact pins are spaced apart equidistantly. The lower row of contact pins is arranged such that the centers of the circular contact faces of the respective contact pin base portions define an imaginary line located at approximately one-half the height of contact plate 842 while the upper row of contact pins is arranged such that the centers of the circular contact faces of the respective contact pin base portions define an imaginary line located at approximately three-quarters the height of contact plate 842.

In the arrangement of contact pins carried by the stationary contact plate 842, and shown in FIGS. 20 and 22, the bottom row of contact pins $S_1$, $P_1$, $P_2$, $S_2$ is electrically coupled to conductors from the power line and the circuit component, while the upper row of contact pins $TS_1$, $TP_1$, $TP_2$, $TS_2$ is employed for testing the power line or the primary circuit of the power driven when the switching device is set in a TEST mode.

Figure 23:
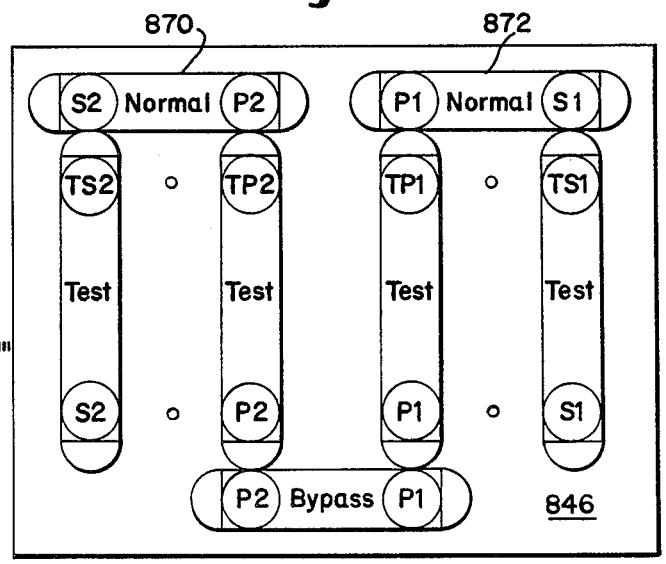
FIG. 23 depicts the contact arrangement carried by the sliding contact plate 846 shown in FIG. 20.

FIG. 23 illustrates the contacts carried by slidable contact plate 846 and their relative positions. Each contact is disposed within a complementarily configured recess formed on the rear side of contact plate 846 such that the rearmost surface of the contact is substantially flush with the rearmost surface of contact plate 846. Each contact comprises an elongated, electrically conductive plate member having a width of approximately the same dimension as the diameter of the base portions of the contact pins carried by stationary contact plate 842. The length of each plate member is of such a dimension as to interconnect one pair of the contact pins carried by the stationary contact plate. A first set of plate members 870 and 872 are positioned in an upper region of contact plate 846, and extend horizontally across the width of contact plate 846. Plate members 870 and 872 are spaced apart by an amount which, when the slidable contact plate is in its first fully depressed position corresponding to the NORMAL mode of operation of the switching device, the end regions of plate members 870 and 872 over the bottom row of contact pins carried by contact plate 842 such that an electrical interconnection between the contact pins $S_2$ and $P_2$ is provided by plate member 870, and an electrical interconnection between contact pins $S_1$ and $P_1$ is provided by plate member 872.

Disposed in the middle region of the rear face of contact plate 846, are plate members 874, 876, 878 and 880. The plate members extend substantially vertically of contact plate 846, and are arranged in parallel in two spaced apart groups such that the upper end regions of plate members 874 and 876 which constitute the first group are disposed, respectively, below the opposite end regions of plate member 870 and the upper end regions of plate members 878 and 880 which constitute the second group are disposed, respectively, below the opposite end regions of plate member 872. This arrangement of plate members 874, 876, 878 and 880 facilitates interconnection of each contact pin in the bottom row of contact pins carried by stationary contact plate 842 with a corresponding vertically aligned contact pin disposed in the upper row of contact pins carried by plate 842 when the slidable contact plate 846 is in its second partially raised position corresponding to the TEST mode of operation of the switching device.

Sliding contact plate 846 also carries, in its lower region, a single plate member 882 which extends horizontally and has opposing end regions disposed below the lower end portions of plate members 876 and 878 such that, when the slidable contact plate is in its third fully raised position corresponding to the BYPASS mode of operation of the switching device, the contact pins $P_1$ and $P_2$ are electrically interconnected.

Each of the embodiments of the switching device of the present invention provides a multiple position selector switch with a unique configuration which simplifies the maintenance for a main series loop connection. The switching device facilitates selective application of power to a power driven component, or it can facilitate isolating the element entirely, thereby allowing the main series loop to operate without interruption even given a failure of one of the power driven components. The switching mechanism also provides the opportunity for an operator to test either the power driven element itself or to carry out tests on the series loop with test equipment, and it permits alteration of the configuration of the series loop so as to isolate certain segments of the loop which may be faulty.

The switching device embodiments of the present invention disclosed above each accomplish all of these functions and provide access to the series system without requiring the opening of connections or splicing of wires or the removing of fixtures. Each embodiment can be installed at an existing fixture base with little or no modification to the base. The primary series loop conductors connect directly to the switch without requiring a connector kit such as those that are typically used in the connection of series lines to isolation transformers. These connection kits typically have disadvantages in that the connections themselves may be subject to certain physical stresses in the environment in which the device may be set and thus the connector kit may result in deteriorating series loop characteristics.

Each embodiment of the switching device can be constructed of corrosion resistant materials for placement within harsh environments. The materials contemplated are water resistant and sunlight resistant, thereby preventing deterioration of the operation of the switch due to its environment. The switching device of the invention can operate in a temperature range of 30° F. to 120° F. and will operate from 0 to 5000 volts and from 0 to 20 amps.

It is clear that the switching device of the invention can be designed so as to be durable and to remain relatively, unaffected by its environmental location. The switching device of the invention can be used to facilitate the maintenance of a main series loop by its connection to one of the loop elements, and allows a user to easily access testing terminals for testing either the entire loop or the particular component of the loop to which the switching device is connected. The switching device of the present invention thus allows the user to alter the configuration of the loop by bypassing segments of the loop to avoid existing faults.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by Letters Patent is:

1. In an electrical circuit for an airport lighting system including a plurality of lights connected to the secondary windings of isolation transformers, the primary windings of which are normally connected in series with one another and with a power source to form a series loop circuit, switch apparatus interposed between said power source and the primary winding of at least one of said isolation transformers comprising, first terminal means including a plurality of contacts for connection to said power source, second terminal means including a plurality of contacts for connection to said one primary winding, third terminal means for interconnecting selected ones of said contacts, said third terminal means being movable with respect to said first and second terminal means between a first position in which said third terminal means connects said contacts in said first terminal means to said contacts in said second terminal means so that said series loop circuit includes said one primary winding, a second position in which, while the contacts in said first terminal means are isolated from the contacts in said second terminal means, said third terminal means connects said contacts in said first terminal means so that said series loop circuit is maintained while said one primary winding is isolated from said series loop circuit, and a third position in which the contacts of said first terminal means are connected to first test terminals and the contacts in said second terminal means are connected to second test terminals, to permit testing of said loop circuit and said isolation transformer, and actuating means for moving said third terminal means to one of said first, second or third positions.

2. In an electrical circuit for an airport lighting system including a plurality of lights connected to the secondary windings of isolation transformers, the primary windings of which are normally connected in series with one another and with a power source to form a series loop circuit, switch apparatus interposed between said power source and the primary winding of at least one of said isolation transformers comprising, first terminal means including a plurality of contacts for connection to said power source, second terminal means including a plurality of contacts for connection to said one primary winding, third terminal means including a first and second sets of test contacts for connection to test terminals, fourth terminal means for interconnecting selected ones of said contacts, said fourth terminal means being movable with respect to said first, second and third terminal means between a first position in which said fourth terminal means connects said contacts in said first terminal means to said contacts in said second terminal means so that said series loop circuit includes said one primary winding, a second position in which, while the contacts in said first terminal means are isolated from the contacts in said second terminal means, said fourth terminal means connects said contacts in said first terminal means so that said series loop circuit is maintained while said one primary winding is isolated from said series loop circuit, and a third position in which the contacts of said first terminal means are connected to said first set of test contacts and the contacts in said second terminal means are connected to said second set of test contacts, to permit testing of said loop circuit and said isolation transformer, and actuating means for moving said fourth terminal means to one of said first, second or third positions.

* * * * *